United States Patent [19]

Mortensen

[11] 4,023,111

[45] May 10, 1977

[54] CURRENT LIMITING DRIVER CIRCUIT

[75] Inventor: Helge H. Mortensen, Munich, Germany

[73] Assignee: National Semiconductor Corporation, Santa Clara, Calif.

[22] Filed: June 3, 1976

[21] Appl. No.: 692,251

[52] U.S. Cl. .................................. 330/28; 307/237; 307/299 B; 315/309; 330/19; 330/23; 330/207 P
[51] Int. Cl.² .................... H03F 1/08; H03K 5/08
[58] Field of Search ............... 307/202, 299 B, 237; 330/19, 23, 28, 207 P

[56] References Cited

UNITED STATES PATENTS

| | | | |
|---|---|---|---|
| 2,847,519 | 8/1958 | Aronson | 330/28 X |
| 3,668,545 | 6/1972 | Van Recklinghausen | 330/207 P |

Primary Examiner—Rudolph V. Rolinec
Assistant Examiner—Lawrence J. Dahl
Attorney, Agent, or Firm—Gail W. Woodward

[57] ABSTRACT

A driver circuit in which the output current is limited to a particular value. A very low value resistance in the output stage senses the current and modulates the conduction to a diode-amplifier combination. The combination employs ratioed emitter areas and currents and can respond to potentials at P-N junction contact potential level. The circuit has a dynamic voltage range that extends to within almost the emitter-collector saturation of a single transistor of zero.

5 Claims, 1 Drawing Figure

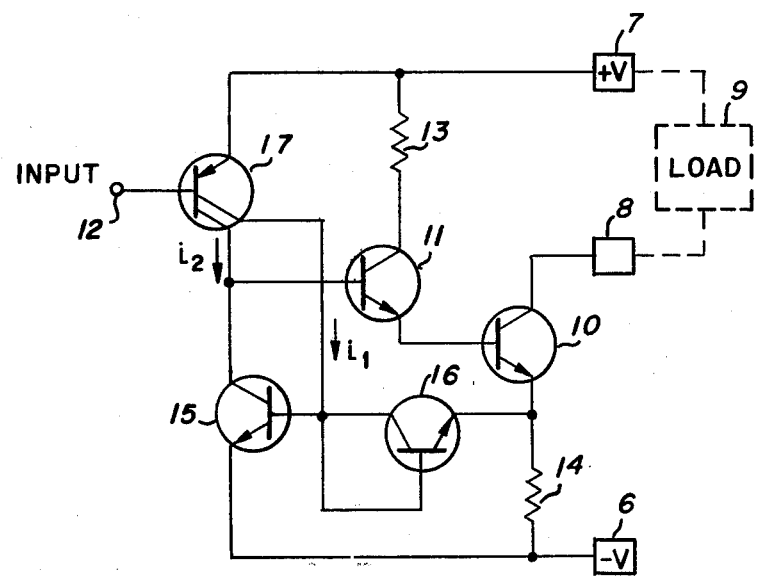

CURRENT LIMITING DRIVER CIRCUIT

BACKGROUND OF THE INVENTION

Many schemes have been proposed to limit the output current of transistor amplifiers. Such circuits usually involve a current sensing resistor in the current circuit and some sort of amlifier-control circuit to limit the current when it rises to some threshold level. In the typical prior art circuits the sensing resistor must generate at least one emitter-base diode voltage ($V_{EB}$) to render the subsequent amplifier control circuit active. In high voltage circuits this is no problem because the typical 0.6 volt $V_{EB}$ is not a very great percentage of the applied voltage. However in battery operated devices it is desirable to operate at low voltage, commonly in the 3-volt range. Here 0.6 volt is an appreciable fraction. In addition since battery voltage falls with use, it is desirable to be able to operate a nominal 3-volt circuit at perhaps down to 2 volts where 0.6 volt represents 30%. Accordingly it would be desirable to employ a current limiter that needs substantially less than a $V_{BE}$ for operation.

SUMMARY OF THE INVENTION

It is an object of the invention to provide a driver circuit with positive current limiting action wherein the output voltage swing approaches zero to within substantially less than one $V_{BE}$.

It is a feature of the circuit that the current at which a driver circuit limits is set be a simple relationship of physical paramaters in addition to very low valued programming resistor.

It is a further feature of the invention that a current limiting driver circuit amenable to IC manufacturing can be manufactured to accurate specifications using conventional processing.

These and other objects and features are achieved in a simple three stage circuit. The output stage includes either a single or, as preferred, a Darlington connected transistor with the load device in its collector and a low value current sensing resistor in its emitter. A feedback circuit consisting of a forward biased diode and a common emitter transistor amplifier responds to the voltage across the sensing resistor and shunts the output stage base input circuits. Thus any current above a particular level will act to pull the output base down and thus limit the current. The input stage is a dual collector common emitter device. One collector drives the output stage and the other collector drives the diode. By properly ratioing the input stage collectors (in terms of area or current) and the areas of the feedback transistor and diode emitters, precise control of the limiting current is achieved while keeping the voltage developed across the sensing resistor extremely low.

BRIEF DESCRIPTION OF THE DRAWING

A single FIGURE of drawing is a schematic diagram showing the circuit of the invention.

DESCRIPTION OF THE INVENTION

In the schematic of the drawing a practical circuit is shown. While the circuit is useful using discrete devices, the IC form is preferred. Pads 6 and 7 are intended for power supply connection to $-V$ and $+V$ bus terminals respectively. Pad 8 is the output terminal suitable for connecting to a load element 9 in which a particular limited current drive is intended.

Transistors 10 and 11 are Darlington connected and driven from transistor 17 via input terminal 12 using conventional input drive circuitry (not shown). The collector of transistor 11 is shown returned to the $+V$ bus by means of resistor 13. However, if desired, resistor 13 could be omitted and the collector of transistor 11 connected to the collector of transistor 10.

A low value resistor 14 is employed to sense the current flowing in transistor 10. Any voltage developed across resistor 14 is coupled to the base of transistor 15 by way of forward biased diode 16 which is shown as a diode connected transistor. The collector to emitter circuit of transistor 15 shunts the base of transistor 11 to the $-V$ bus. Transistor 17 is shown as a multiple collector device although two separate transistors could be used. One collector drives the Darlington output stage and the other collector drives the diode 16.

Input terminal 12 drives the base of transistor 17 and operates in the vicinity of one $V_{BE}$ (one base to emitter voltage drop) below the $+V$ bus potential. While not shown means will ordinarily applied to prevent excessive drive signals to the base of transistor 17. The collectors of transistor 17 can be of different areas so as to scale currents $i_1$ and $i_2$. Current $i_2$ is the combined collector current of transistor 15 along with the base current of transistor 11. The conduction of transistor 15 sets the division ratio of $i_2$ between the two devices. Current $i_1$ is the combined base current of transistor 15 and the current in diode 16. The conduction of diode 16 controls the current division ratio of $i_1$ between the two devices. One important parameter of the circuit is scaling. It is necessary that the ratio of the two transistor 17 collectors, or $i_2/i_1$, when multiplied by the ratio of emitter areas of diode 16 and transistor 15, or $A_{16}/A_{15}$, be greater than 1. For this condition the circuit is stable and the current through transistor 10 will be limited to a particular maximum value.

At the limiting current a particular voltage will appear resistor 14. If this voltage tends to rise, the conduction through diode 16 would be reduced thereby forcing a greater proportion of $i_1$ into the base of transistor 15. This would cause greater conduction in transistor 15 and pull the base of transistor 11 toward the $-V$ bus. This in turn would tend to lower the voltage across resistor 14 thereby offsetting the hypothetical rise. If the voltage across resistor 14 tends to fall, diode 16 conduction would rise thereby diverting a larger proportion of $i_1$ away from the base of transistor 15. This reduces transistor 15 conduction and allows the base of transistor 11 to be pulled toward the $+V$ bus. This would tend to offset the hypothetical fall.

Using the simplifying assumptions that transistor current gain is very large and that the output stage current is much larger than $i_1$, the limiting current $I_{LIM}$ is expressed as follows:

$$I_{LIM} = \frac{kT}{q R_{14}} \times 1_n \frac{A_{16} i_2}{A_{15} i_1} \quad (1)$$

where:
$k$ is boltzmans constant
$T$ is temperature in degrees kelvin
$q$ is the charge on an electron
$A_{16}$ is the area of diode 16 emitter $A_{15}$ is the area of transistor 15 emitter, and $i_2$ and $i_1$ are the currents in the collectors of transistor 17 flowing in transistor 15 and diode 16 respectively.

From the formula it is clear that when the area ratio of diode 16 to transistor 15 is multiplied by the ratio of $i_2$ to $i_1$ the result must exceed unity. Since kT/q is about 0.026 volt at room temperature, the order of the voltage that appears across resistor 14 is in the tens of millivolts range. As a practical matter the lower limit of voltage is established at a value that will accomodate an acceptable variation in transistor parameters. Typical IC process variables are such that a lower limit of about 18 mv is practical.

Thus the output stage can deliver the limited current at an extremely low voltage. This would be a few tens of millivolts above $V_{CESAT}$ of transistor 10.

From the above it is clear that the circuit of the invention will be active when the power supply voltage exceeds the required load device 9 voltage by only about 0.2 volt. This is of great importance in battery operated equipment. For example if the load requires 2 volts to operate, a three volt battery might be employed. The above described circuit would be functional until the battery voltage declined from 3 to 2.2 volts. Using typical prior art circuits where the terminal voltage is typically a $V_{BE} + V_{CESAT}$ above battery voltage the prior art circuit would cease functioning at about 2.8 volts or only slightly under the nominal 3 volts.

From equation 1 it can be seen that a 20 ma load device in a circuit where $i_2$ and $i_1$ are made equal and $A_{16}$ is made about 3 times $A_{15}$ resistor 14 would be 1.43 ohms and the voltage across resistor 14 at room temperature (300° Kelvin) would be 28.6 millivolts.

The above analysis shows that the value of resistor 14 is critical and all other critical values are related to device areas. These critical areas are the relative collector areas of transistor 17 and the relative emitter areas of transistor 15 and diode 16. In IC fabrication these area ratios are readily controlled to precise values using conventional processing. Thus the single precision element is resistor 14 which is of low ohmic value and relatively easily controlled in IC processing. Thus the circuit of the invention while useful in discrete circuits is particularly amenable to ICs.

The above description shows that stable current limited circuit performance is available but, as shown in equation 1, the limited current is temperature sensitive. $I_{LIM}$ will rise with temperature at about 1% for each 3 degress K temperature rise. Thus in going from room temperature to 300° C, the current will double. If no change with temperature is desired, a temperature compensating element can be incorporated into the circuit. However under certain conditions the characteristic can be used to advantage.

In one application of the circuit of the invention a light emitting diode (LED) is connected between terminals 7 and 8. The LED employs semiconductor materials and carrier flow across a barrier so that the light emission efficiency tends to be poorer at higher temperatures. Such a device in the circuit would tend to be compensated. That is as the temperature rises and the LED efficiency declines, more current will be passed thus maintaining a relatively constant brightness. Since the LED and the circuit are both based upon a semiconductor junction property, such compensation will be of the correct magnitude.

A circuit having a sharply limited maximum output current has been shown and its performance described. There are many equivalents and modifications that will occur to a person skilled in the art. For example the Darlington stage could be replaced by a single transistor or a three or multiple element Darlington circuit used. Transistor 15 could also be replaced by any high gain signal inverting device.. Also the PNP and NPN devices could be interchanged along with a reversal of power supply polarity. Accordingly it is intended that my invention be limited only by the following claims.

I claim:

1. An amplifier circuit having a limited and well defined output current and a large dynamic output voltage range comprising:
   an output stage including output transistor means having emitter, base and collector terminals, means for coupling said collector terminal to a load element whereby said load element may be energized in combination with a power supply from said output stage, current sensing resistor means coupled to said emitter whereby said current sensing resistor means develops a potential proportional to the current in said load element,
   a feedback stage including a common emitter connected transistor having a base terminal and collector terminal, said collector terminal being coupled to said output stage base terminal and said base terminal coupled by means of a forward biased diode to said output stage emitter terminal and said current sensing resistor, and
   a driver stage including dual collector common emitter connected transistor means having a base terminal and two collector terminals, said base terminal being coupled to comprise the input of said amplifier, one of said collector terminals being coupled to said base terminal of said output transistor and the collector terminal of said feedback stage transistor, and the other of said collector terminals being coupled to the base of terminal of said feedback stage transistors whereby said output current is sharply limited at a predetermined value.

2. The amplifier of claim 1 wherein the collectors of said driver transistor and the emitter areas of said diode and said feedback stage transistor are scaled to that when the ratio of the currents in said feedback transistor collector and said diode is multiplied by the ratio of the areas of said emitters of said feedback transistor and said diode the result is greater than unity.

3. The amplifier of claim 2 wherein the emitter of said diode is made greater than the area of said feedback transistor emitter.

4. The amplifier of claim 2 wherein the current through said diode is made smaller than the current through said feedback transistor.

5. The amplifier of claim 2 wherein the area of said diode emitter is greater than the area of said feedback transistor emitter and the current through said diode is made smaller than the current through said feedback transistor.

* * * * *